United States Patent
Ohara

(10) Patent No.: US 7,910,423 B2
(45) Date of Patent: Mar. 22, 2011

(54) SEMICONDUCTOR DEVICE AND METHOD OF MANUFACTURING THE SAME

(75) Inventor: Shinji Ohara, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 94 days.

(21) Appl. No.: 12/364,820

(22) Filed: Feb. 3, 2009

(65) Prior Publication Data

US 2009/0194842 A1    Aug. 6, 2009

(30) Foreign Application Priority Data

Feb. 6, 2008 (JP) ................. 2008-026641

(51) Int. Cl.
*H01L 21/8238* (2006.01)

(52) U.S. Cl. ........ 438/199; 438/401; 257/374; 257/350; 257/797; 257/E21.546; 257/E21.564; 257/E21.642

(58) Field of Classification Search .................. 438/401
See application file for complete search history.

(56) References Cited

U.S. PATENT DOCUMENTS

| | | | | |
|---|---|---|---|---|
| 6,252,281 B1 * | 6/2001 | Yamamoto et al. | ........... | 257/350 |
| 7,067,371 B2 * | 6/2006 | Ning et al. | .................... | 438/234 |
| 2003/0094641 A1 * | 5/2003 | Gonzalez et al. | ............. | 257/296 |
| 2006/0261410 A1 * | 11/2006 | Ohguro | .......................... | 257/350 |
| 2007/0077719 A1 * | 4/2007 | Koyama et al. | ............... | 438/355 |

FOREIGN PATENT DOCUMENTS

| | | |
|---|---|---|
| JP | 2003-68877 A | 3/2003 |
| JP | 2005-19453 A | 1/2005 |

\* cited by examiner

*Primary Examiner* — Matthew S Smith
*Assistant Examiner* — Shaka Scarlett
(74) *Attorney, Agent, or Firm* — Sughrue Mion, PLLC

(57) ABSTRACT

A semiconductor device includes an SOI substrate, a first STI-type isolation region, a second STI-type isolation region, and an alignment mark region. The SOI substrate includes a support substrate, an insulating layer deposited on the support substrate, and a semiconductor layer which includes a thin film region and a thick film region. The thin film region includes a first semiconductor layer deposited on the support substrate, and the thick film region includes the first semiconductor layer and a second semiconductor layer deposited on a part of the first semiconductor layer. The first STI-type isolation region is disposed at the thin film region. The second STI-type isolation region is disposed at the thick film region. The alignment mark region is disposed at the thick film region. An alignment mark to be used for alignment of the second STI-type isolation region is disposed at the alignment mark region.

19 Claims, 13 Drawing Sheets

SEMICONDUCTOR DEVICE AND METHOD OF MANUFACTURING THE SAME

BACKGROUND OF THE INVENTION

1. Field of the Invention

The present invention relates to a semiconductor device, particularly a semiconductor device including an SOI (Silicon On Insulator) substrate, and to a method of manufacturing the same.

Priority is claimed on Japanese Patent Application No. 2008-026641, filed on Feb. 6, 2008, the content of which is incorporated herein by reference.

2. Description of the Related Art

Recently, semiconductor devices including an SOI substrate have been developed with higher performances. The SOI substrate includes a support substrate, an insulating layer provided on the support substrate, and a semiconductor layer (such as a silicon layer) provided on the insulating layer. A transistor or the like is formed in the semiconductor layer.

Japanese Patent, Laid-open Publication Nos. 2003-68877 and 2005-19453 disclose semiconductor devices using the SOI substrate. Japanese Patent, Laid-open Publication No. 2003-68877 discloses a capacitorless DRAM (Dynamic Random Access Memory) using a floating-gate MOS transistor. Japanese Patent, Laid-open Publication No. 2005-19453 discloses SRAM (Static Random Access Memory) using a fully-depleted MOS transistor.

In the disclosed semiconductor devices, the semiconductor layer included in the SOI substrate has two regions of different thicknesses (thin film region and thick film region) to achieve desired electronic characteristics. A memory cell is mainly formed in the thin film region, and a peripheral circuit for inputting and outputting data to the memory cell is mainly formed in the thick film region.

In the conventional semiconductor devices each including the SOI substrate, the following problems arise when element isolation regions of an STI (Shallow Trench Isolation) structure is formed in the semiconductor layer including the two regions of different thicknesses.

FIG. 22A is a cross-sectional view illustrating a conventional semiconductor device 220 when STI-type isolation regions are formed. The semiconductor device 220 includes an SOI substrate 200 including a support substrate 201, an insulating film 202 provided on the support substrate 201, and a semiconductor layer 203 provided on the insulating film 202. The semiconductor layer 203 includes a thin region A and a thick region B. For convenience, the semiconductor layer 203 in the region A is denoted as a semiconductor layer 203a, and the semiconductor layer 203 in the region B is denoted as a semiconductor layer 203b.

In the semiconductor device 220, thicknesses of the SOI substrate (from the rear surface of the support substrate to the upper surface of the semiconductor layer) in the regions A and B are Da and Db, respectively. STI-type isolation regions 204a and 204b made of insulating films are formed in the semiconductor layers 203a and 203b. In the region B, the semiconductor layer 203b is thicker than the STI-type isolation regions 204b, and therefore the bottom surfaces of the STI-type isolation regions 204b are not in contact with the insulating layer 202. Thereby, a potential of the semiconductor layer 203b can easily be fixed by a given voltage being applied to the semiconductor layer 203b.

To form the semiconductor device 220 as shown in FIG. 22A, the SOI substrate 200 including the semiconductor layer 203 including the two regions of different thicknesses is prepared by a known method disclosed in, for example, Japanese Patent, Laid-open Publication No. 2005-19453. Then, a photoresist film 208 is formed on the semiconductor layer 203, a resist pattern is formed by exposing the photoresist film 208, and then the STI-type isolation regions 204 (204a and 204b) are collectively formed in the regions A and B.

With the further miniaturization of semiconductor devices, a higher resolution is required for a stepper (exposure apparatus) used for manufacturing semiconductor devices. To achieve a high resolution, a light source of a short wavelength and a large aperture lens are used in the stepper, and a focal depth is shallow. Thereby, planarization of a surface targeted for lithography is important in a lithography process using a stepper of high resolution.

However, the SOI substrate 200 has two different thicknesses Da and Db, and thereby a step occurs on a surface of the photoresist film 208, causing misalignment of focuses upon the STI-type isolation regions 204a and 204b in the regions A and B being simultaneously exposed. As a result, it is difficult to simultaneously form desired patterns in the regions A and B. In other words, it is difficult to simultaneously form the microscopic STI-type isolation regions 204 in the semiconductor layer 203 including the regions of different thicknesses with the photoresist 208 as a mask. The further semiconductor devices are miniaturized, the further misalignment of focuses upon lithography affects a pattern formation.

It can be considered to separately form the STI-type isolation regions 204a and 204b in the regions A and B. In this case, however, the following problems arise.

FIG. 23 is a cross-sectional view schematically illustrating a semiconductor device in which an insulating film is formed in the thin film region A after the STI-type isolation regions are formed in the thick film region B. The STI-type isolation regions are generally formed by providing recesses in the semiconductor layer, embedding insulators therein, and planarizing the surface thereof. Hereinafter, problems in this case are explained.

In a method of manufacturing a semiconductor device 230 as shown in FIG. 23, STI-type isolation regions 204b are formed only in the region B, followed by forming a silicon oxide film ($SiO_2$) 205 and a silicon nitride film ($Si_3N_4$) 206 on the entire surface of the semiconductor layer 203 (203a and 203b) included in the SOI substrate 200. Then, the silicon oxide film 205 and the silicon nitride film 206 at portions that will be STI-type isolation regions in the region A are etched with a photoresist film (not shown) as a mask to form openings. At this time, misalignment of focuses does not occur since exposure of the photoresist film is performed only in the region A. Then, the semiconductor layer 203a in the openings is removed to form the openings 209. Lastly, an insulating film 207, such as a silicon nitride film, is formed on the silicon nitride film 206 and fills up the openings 209, and thereby the semiconductor device 230 is formed.

The insulating film 207, the silicon nitride film 206, and the silicon oxide film 205 that remain on the SOI substrate 200 are removed in the subsequent processes, and thereby the semiconductor device 220 as shown in FIG. 22A is formed. At this time, the remaining films on the SOI substrate 200 are removed by the surface of the SOI substrate 200 being planarized by CMP (Chemical Mechanical Polishing).

However, the SOI substrate 200 has different thicknesses in the regions A and B, and therefore there is a step on the surface targeted for CMP. Accordingly, it is difficult to planarize the entire surface of the semiconductor device 230 by CMP except for when the total area of the regions A and B is extremely smaller than that of the entire SOI substrate 200. When capacitorless DRAM is formed, for example, the total area ratio of the regions A and B is approximately 6:4, and multiple regions A and B are mixed. Thereby, film thicknesses after CMP (from the rear surface of the SOI substrate to the uppermost surface) cannot be uniformed even if the surface of the semiconductor device 230 is planarized by CMP, causing fluctuation in film thicknesses due to steps among adjacent regions. Therefore, it has been difficult to uniformly form the STI-type isolation regions 204a and 204b in the SOI substrate 200, preventing progress of miniaturization. In other words, it has been difficult to separately form, by CMP, the microscopic STI-type isolation regions 204a and 204b in the SOI substrate 200 including the semiconductor layer 203 including the regions of different thicknesses.

To separately form the STI-type isolation regions 204a and 204b in the regions A and B, alignment has been problematic upon exposure of a photoresist film for forming the STI-type isolation regions 204a. In other words, alignment of a pattern of the STI-type isolation regions 204a is preferably carried out with the position of a pattern of the previously-formed STI-type isolation regions 204b as a reference so that relative positions between the STI-type isolation regions 204a and 204b are maintained.

If the photoresist film for forming the STI-type isolation regions 204a in the region A is formed (exposed) with the position of the pattern of the STI-type isolation regions 204b in the region B as a reference, the upper surfaces of the STI-type isolation regions 204b and the semiconductor layer 203b are substantially equal since the STI-type isolation regions 204b have already been formed. Additionally, the silicon oxide film 205, the silicon nitride film 206, and the photoresist film (not shown) are deposited on the STI-type isolation regions 204b when the photoresist is exposed.

As a result, there has been need to detect the position of alignment marks formed using the pattern of the STI-type isolation regions 204b through the multiple deposited films upon the alignment of a pattern of the STI-type isolation regions 204a. However, it has been difficult to precisely detect the positions of the alignment marks since multiple films have been deposited on the alignment marks and there are few steps on the upper surface of the semiconductor layer 203b. Therefore, misalignment is likely to occur, which has been one of factors preventing miniaturization of semiconductor devices.

SUMMARY

In one embodiment, there is provided a semiconductor device which may include an SOI substrate, a first STI-type isolation region, a second STI-type isolation region, and an alignment mark region. The SOI substrate includes a support substrate, an insulating layer deposited on the support substrate, and a semiconductor layer which includes a thin film region and a thick film region. The thin film region includes a first semiconductor layer deposited on the support substrate, and the thick film region includes the first semiconductor layer and a second semiconductor layer deposited on a part of the first semiconductor layer. The first STI-type isolation region is disposed at the thin film region. The second STI-type isolation region is disposed at the thick film region. The alignment mark region is disposed at the thick film region. An alignment mark to be used for alignment of the second STI-type isolation region is disposed at the alignment mark region.

According to the semiconductor device, the semiconductor layer includes the thin and thick film regions, and the first and second STI-type isolation regions are separately formed therein. Thereby, the shapes of the first and second STI-type isolation regions formed in the regions of different thicknesses included in the semiconductor layer can be optimized. Additionally, the thick film region includes the alignment mark region including the alignment mark that is used for a positioning of the second STI-type isolation region. Thereby, the second STI-type isolation region can precisely be formed. As a result, misalignment of the separately formed STI-type isolation regions can be prevented, and miniaturization can be simplified.

In another embodiment, there is provided a method of manufacturing a semiconductor device which may include the following processes. An SOI substrate comprising a support substrate, an insulating layer deposited on the support substrate, and a semiconductor layer deposited on the insulating layer are prepared. Then, a first STI-type isolation region is formed in a first region of the semiconductor layer. Then, a first mask layer is formed to cover an upper surface of the semiconductor layer at the first region. Then, a semiconductor film is formed on the semiconductor layer uncovered by the first mask layer to form a second region of the semiconductor layer. Then, a second mask layer is formed to cover an upper surface of the first mask layer at the first region and an upper surface of the semiconductor film at the second region. Then, an opening pattern is formed in the second mask layer in the second region. Then, a second STI-type isolation region is formed in the second region using the opening pattern. Then, the first mask layer and the second mask layer are removed.

In another embodiment, there is provided a method of manufacturing a semiconductor device which includes an SOI substrate including a support substrate, an insulating layer deposited on the support substrate, and a semiconductor layer deposited on the insulating layer. The method may include the following processes. A pair of first STI-type isolation regions is formed in a first region of the semiconductor layer. Then, a first mask layer is formed to cover the first region. Then, a semiconductor film is formed on the semiconductor layer uncovered by the first mask layer to form a second region of the semiconductor layer. Then, a second mask layer is formed to cover the first region and the second region. Then, an opening pattern is formed in the second mask layer in the second region. Then, a pair of second STI-type isolation regions is formed in the second region using the opening pattern. Then, the first mask layer and the second mask layer in the first region are removed.

According to the methods, the first and second STI-type isolation regions are separately formed in the SOI substrate including the regions of different thicknesses. Thereby, miniaturization can easily be achieved since a problem of focal depth does not arise in lithography.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. The accompanying drawings explain the embodiments, and the size, the thickness, and the like of each illustrated portion might be different from those of each portion of an actual semiconductor device.

Those skilled in the art will recognize that many alternative embodiments can be accomplished using the teachings of the present invention and that the invention is not limited to the embodiments illustrated herein for explanatory purposes.

First Embodiment

Figure 1:
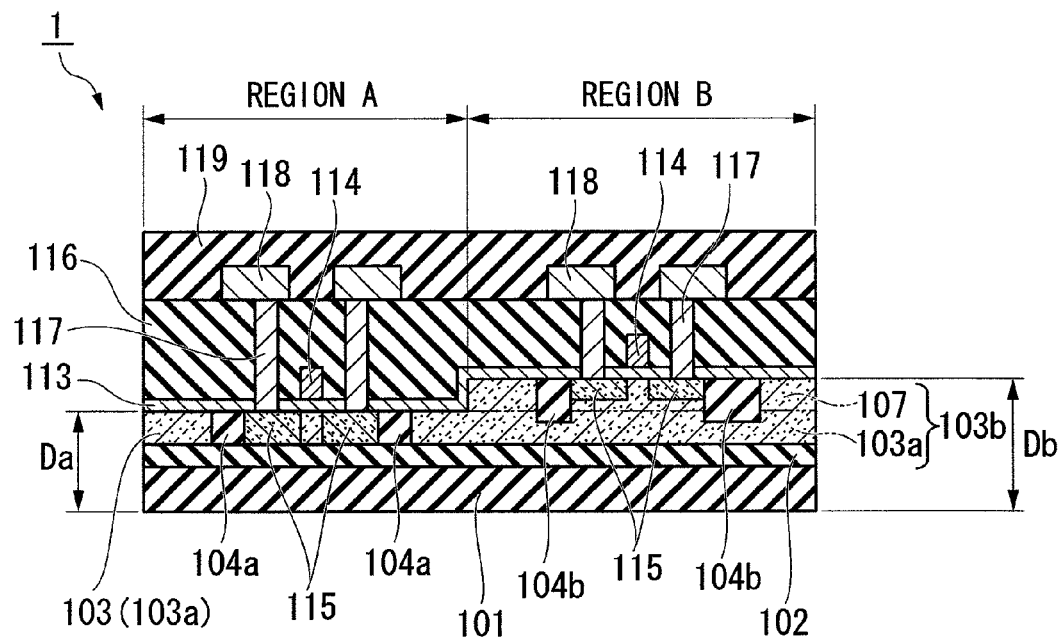
FIG. 1 is a cross-sectional view illustrating a semiconductor device according to a first embodiment of the present invention.

Hereinafter, the structure of a semiconductor device 1 according to a first embodiment is explained. FIG. 1 is a cross-sectional view illustrating the semiconductor device 1.

The semiconductor device 1 is formed on an SOI substrate 100 including a support substrate 101, an insulating layer 102 deposited on the support substrate 101, and a semiconductor layer 103 deposited on the insulating layer 102. The semiconductor layer 103 schematically includes a thin film region including a thin semiconductor layer (first semiconductor layer) 103a and a thick film region including a thick semiconductor layer 103b. Hereinafter, the thin and the thick film regions are respectively denoted as regions A and B.

In the region A, the semiconductor layer 103a is made of silicon of approximately 20 nm in thickness. Although a conductivity type of the semiconductor layer 103a is not particularly limited and can appropriately be selected, a p-type is used as an example for explanations. The thickness of the SOI substrate 100 (total thickness of the support substrate 101, the insulating layer 102, and the semiconductor layer 103a) is denoted as Da.

In the semiconductor layer 103a, first STI-type isolation regions 104a equal to the semiconductor layer 103a in thickness are formed by embedding insulators made of silicon oxide films from a surface opposite to the insulating layer 102. The upper surfaces of the first STI-type isolation regions 104a are substantially identical to that of the semiconductor layer 103a. The bottom surfaces of the embedded insulators included in the first STI-type isolation regions 104a are in contact with the insulating layer 102.

S/D (source and/or drain) regions 115 are formed in the semiconductor layer 103a between the first STI-type isolation regions 104a. The S/D regions 115 are formed from the surface opposite to the insulating layer 102 similarly to the first STI-type isolation regions 104a. The bottom surfaces of the S/D regions 115 are in contact with the insulating layer 102. A conductivity type of the S/D regions 115 is preferably, but not limited to, an n-type by ion-implantation of an impurity, such as phosphorus, since the semiconductor layer 103a is the p-type in the first embodiment.

A gate insulating film 113 made of, for example, a silicon oxide film, is deposited on the semiconductor layer 103a. A gate electrode 114 made of poly-silicon into which an impurity, such as phosphorus, is implanted is formed on the gate insulating film 113. The S/D regions 115 are positioned at both sides of the gate electrode 114. An inter-layer insulating film 116 made of, for example, a silicon oxide film, is deposited to cover the gate insulating film 113 and the gate electrode 114. A wiring layer 118 made of, for example, aluminum (Al), copper (Cu), and tungsten (W), is formed on the inter-layer insulating film 116. Contact plugs 117 are formed to penetrate through the gate insulating film 113 and the inter-layer insulating film 116 and connect the S/D regions 115 and the wiring layer 118. The insulating film 119 is deposited to cover the inter-layer insulating film 116 and the wiring layer 118. Thereby, the region A is a memory cell region in the semiconductor device 1.

Hereinafter, only the difference from the region A is explained with respect to the region B.

In the region B, the semiconductor layer 103b includes the semiconductor layer 103a of approximately 20 nm in thickness and a semiconductor film (second semiconductor layer, hereinafter "epitaxial film" for clear discrimination) 107 made of silicon, formed on the semiconductor layer 103a by a film forming method, such as selective epitaxial growth. A thickness of the epitaxial film 107 is not particularly limited and can appropriately be selected. The film forming method is not limited to the selective epitaxial growth. The thickness of the SOI substrate 100 (total thickness of the support substrate 101, the insulating layer 102, the semiconductor layer 103a, and the epitaxial film 107) is denoted as Db. Although a boundary between the epitaxial film 107 and the semiconductor layer 103a is illustrated in FIG. 1 for explanations, the epitaxial film 107 and the semiconductor layer 103a are actually integrated and there is no boundary therebetween.

In the semiconductor layer 103b, second STI-type isolation regions 104b are provided which are thinner than the semiconductor layer 103b and formed by embedding insulators made of a silicon oxide film from a surface opposite to the insulating layer 102. The upper surfaces of the second STI-type isolation regions 104b are substantially identical to that of the semiconductor layer 103b. The bottom surfaces of the insulators embedded in the second STI-type isolation regions 104a are not in contact with the insulating layer 102.

S/D regions 115 are formed in the semiconductor layer 103b between the second STI-type isolation regions 104b. The S/D regions 115 are formed from the surface opposite to the insulating layer 102 similarly to the second STI-type isolation regions 104b. The bottom surfaces of the S/D regions 115 are not in contact with the insulating layer 102. Thereby, the region B is a peripheral region in the semiconductor device 1.

In the semiconductor device 1 having the structure explained above, a potential of the semiconductor layer 103b can easily be fixed by a given voltage being applied to the semiconductor layer 103b.

Hereinafter, a method of manufacturing the semiconductor device 1 in the first embodiment is explained. FIGS. 2 to 16 are cross-sectional views indicative of a schematic process flow illustrating a method of manufacturing the semiconductor device 1 according to the first embodiment.

The method of manufacturing the semiconductor device 1 according to the first embodiment includes processes of: forming a first mask pattern to form a thin film region; forming first STI-type isolation regions and alignment mark regions; forming a second mask layer covering the thin film region; forming an epitaxial film to form a thick film region; forming a third mask layer covering the thin and the thick film regions, and alignment marks; performing alignment of second STI-type isolation regions; forming a third mask pattern in the thick region; forming STI-type isolation regions; and removing the third mask pattern. Hereinafter, each process is explained in detail.

In the process of forming a first mask pattern to form a thin film region, the SOI substrate 100 including the support substrate 101, the insulating layer 102, and the semiconductor layer 103a is prepared. At this stage, a surface of the semiconductor layer 103a which is a surface of the SOI substrate 100 is flat, and the thickness of the semiconductor layer 103a is constant over the entire SOI substrate 100. For explanations, regions which will finally be the thin and the thick film regions are respectively denoted as regions A and B. Separately from the regions A and B, a region C is provided wherein alignment marks to be used upon alignment in the process of forming the third mask pattern are arranged. The STI-type isolation regions 104a are formed in the region A by STI. Additionally, the insulators 104c embedded into the semiconductor layer 103a in the region C to be used as alignment marks are formed.

Figure 2:
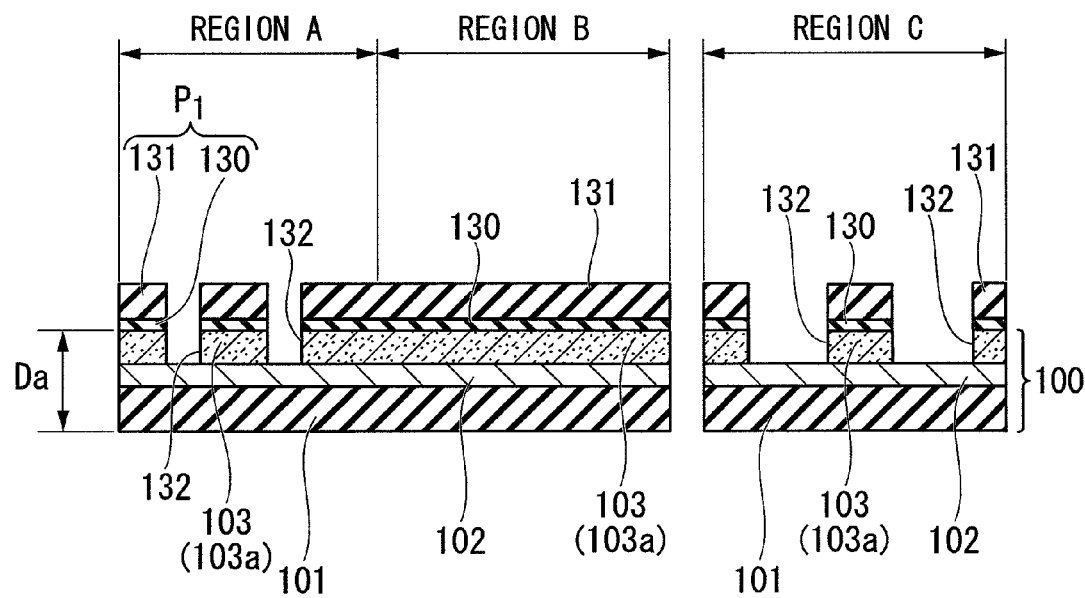
FIGS. 2 to 16 are cross-sectional views indicative of a schematic process flow illustrating a method of manufacturing the semiconductor device according to the first embodiment.

Specifically, a silicon oxide film 130 of approximately 10 nm in thickness and a silicon nitride film 131 of approximately 100 nm in thickness are formed on the semiconductor layer 103a as shown in FIG. 2. Then, dry etching is performed with a patterned photoresist film (not shown) as a mask to form a first mask pattern $P_1$ made of the silicon oxide film 130 and the silicon nitride film 131 at positions where the first STI-type isolation regions 104a will be formed. The region where the first mask pattern P1 is formed is the thin film region, i.e., the region A.

In the process of forming the first STI-type isolation regions, the semiconductor layer 103a is etched with the first mask pattern $P_1$ as a mask to form recesses 132. This etching is performed until the surface of the insulating layer 102 included in the SOI substrate 100 is exposed.

Figure 3:
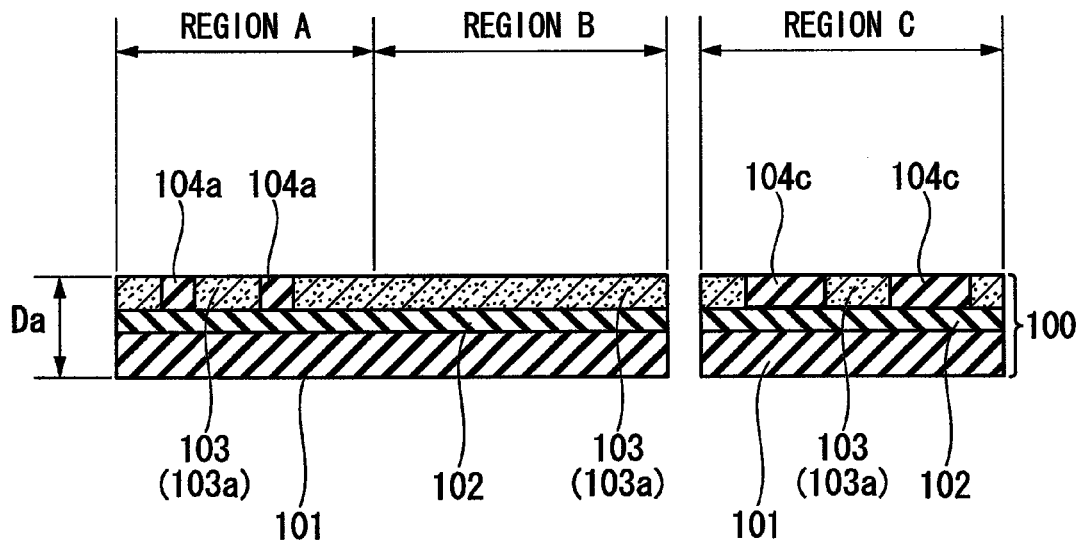

Then, a silicon oxide film ($SiO_2$) is formed to fill up the recesses 132 by CVD (Chemical Vapor Deposition), followed by planarization of the surface thereof by CMP. Then, the silicon nitride film 131 and the silicon oxide film 130 are removed, and thereby the first STI-type isolation regions 104a and the embedded insulators 104c to be used as alignment marks are formed as shown in FIG. 3. A condition of CMP is adjusted such that the surfaces of the first STI-type isolation regions 104a and the embedded insulators 104c are substantially identical to that of the semiconductor layer 103a in height.

The region where the embedded insulators 104c are formed is the alignment mark region, i.e., the region C. The embedded insulators 104c will be bases of alignment marks to be used when a third mask pattern is exposed to form the second STI-type isolation regions 104b. The alignment marks are a pattern in a particular shape for alignment upon lithography which is performed by detecting positions of the alignment marks on the SOI substrate 100 using, for example, reflective diffractive light. The insulators included in the first STI-type isolation regions 104a and the embedded insulators 104c to be used as alignment marks are in contact with the insulating layer 102.

Figure 4:
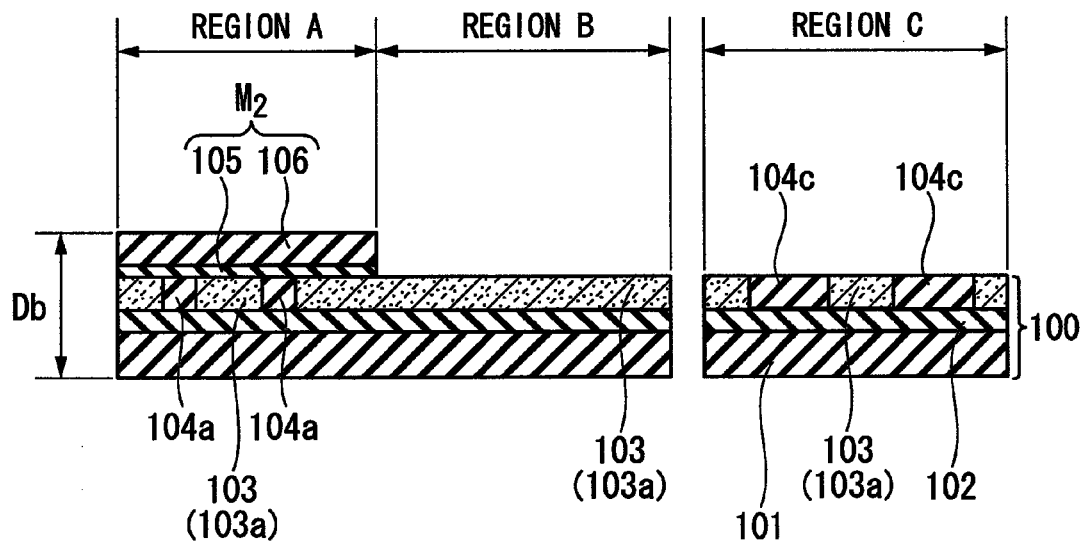

In the process of forming the second mask layer $M_2$ covering the thin film region (region A), a silicon oxide film 105 of approximately 10 nm in thickness and a silicon nitride film 106 of approximately 200 nm in thickness are deposited to cover the first STI-type isolation regions 104a, the embedded insulators 104c, and the semiconductor layer 103a. Then, patterning is performed so that the second mask layer $M_2$ including the silicon oxide film 105 and the silicon nitride film 106 remains only in the region A as shown in FIG. 4. This patterning may be performed by dry etching with a photoresist film (not shown) as a mask. A thickness between the rear surface of the support substrate 101 and the upper surface of the silicon nitride film 106 is denoted as Db.

Figure 5:
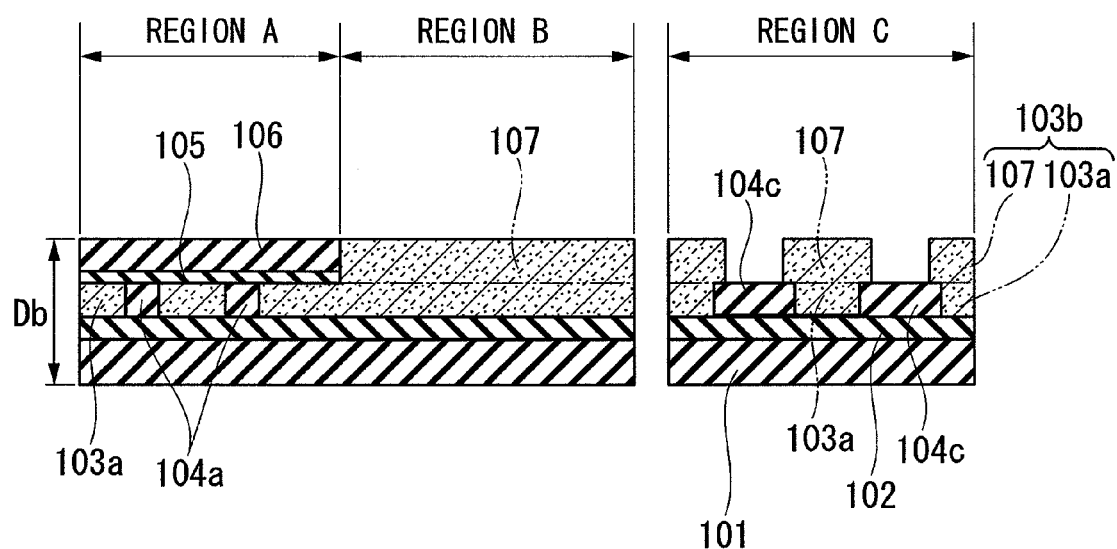

In the process of forming an epitaxial film 107 to form the thick film region (region B), the epitaxial film 107 is selectively formed by selective epitaxial growth only on an exposed surface of the semiconductor layer 103a which is uncovered by the second mask layer $M_2$ such that the upper surface of the epitaxial film 107 is substantially identical to the upper surface of the silicon nitride film 106 in height (depth Db) as shown in FIG. 5. Then, the epitaxial film 107 and the semiconductor layer 103a form a new semiconductor layer 103b in the thick film region B and the alignment mark region C.

Although a boundary between the epitaxial film 107 and the semiconductor layer 103a is illustrated in FIG. 5, the epitaxial film 107 and the semiconductor layer 103a are actually integrated, and therefore no clear boundary is present. If a thickness of the epitaxial film 107 is required to be changed, the silicon nitride film 106 may be formed with a desired thickness in the process of forming the second mask layer $M_2$ as shown in FIG. 4 so that the surfaces of the epitaxial film 107 and the silicon nitride film 106 are identical in height as shown in FIG. 5.

In the region C, the epitaxial film 107 is formed only on the exposed silicon surface of the semiconductor layer 103a and not on the embedded insulators 104c as shown in FIG. 5. However, the epitaxial film 107 grows also in the horizontal direction and therefore on the circumferences of the upper surfaces of the embedded insulators 104c. Accordingly, widths of the embedded insulators 104c are preliminarily adjusted so that the epitaxial films 107 grown in the horizontal direction do not contact each other.

Figure 6:
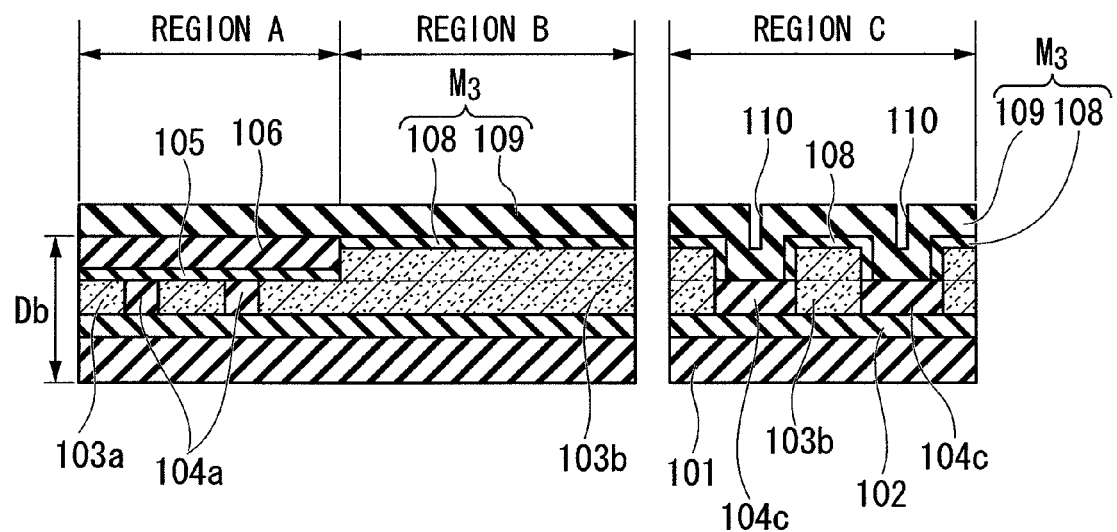
Figure 7:
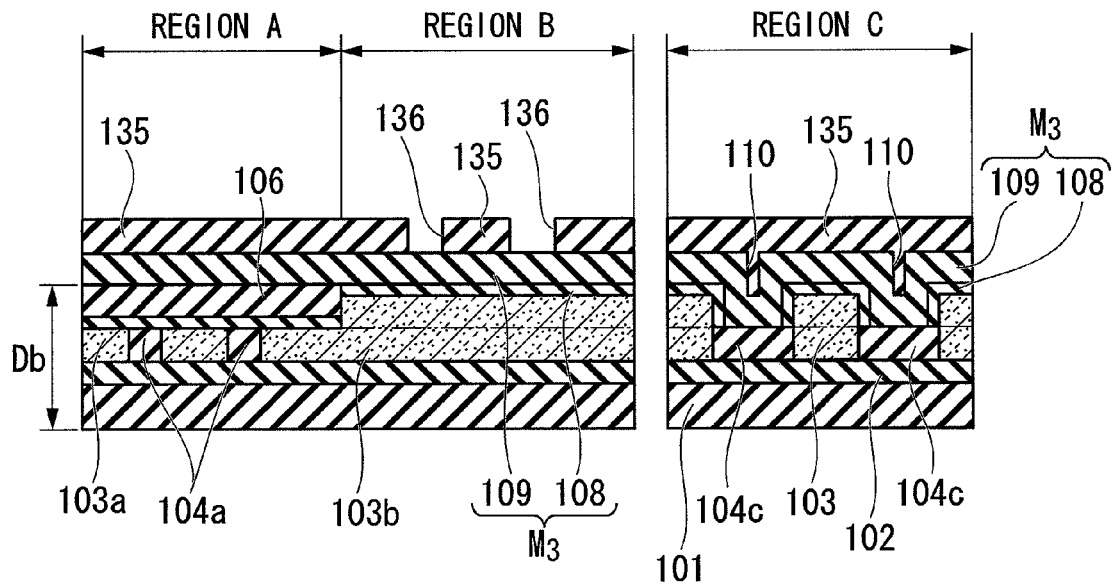

In the process of forming the third mask layer and the alignment marks, a silicon oxide film 108 of approximately 10 nm is formed on the exposed silicon surface by thermal oxidation as shown in FIG. 6. Then, a silicon nitride film 109 of approximately 100 nm is formed on the entire surface of the regions A, B, and C by CVD. Thereby, the third mask layer $M_3$ including the silicon oxide film 108 and the silicon nitride film 109 is formed. In the region C, the width of each embedded insulator 104c is preliminarily set to be more than twice the thickness of the silicon nitride film 109 so that recesses 110 not filled with the silicon nitride film 109 are formed. These recesses 110 will be used as alignment marks. In other words, the alignment marks are a pattern including the recesses 110.

In the process of performing alignment of the second STI-type isolation regions, a photoresist film 135 is formed on the silicon nitride film 109, followed by photolithography using a pattern of the STI-type isolation regions 104b to be formed in the region B.

Since the recesses 110 made of the silicon nitride film 109 have been formed as alignment marks in the region C at this time, alignment can precisely be performed upon lithography even if the recesses 110 are filled with the photoresist film 135. In other words, in a general method in which laser is irradiated to detect positions of the alignment marks using refractive diffractive light thereof, the refractive diffractive light can easily be obtained from laser passing through the photoresist film 135 and being reflected at the side surfaces of the recesses 110, enabling easy detection of the positions of the alignment marks. Widths of the recesses 110 are not particularly limited and may be any value as long as the recesses 110 are not completely filled with the silicon nitride film 109. More preferably, widths of the embedded insulators 104c which are formed first are preliminarily adjusted such that widths of the recesses 110 are optimal according to alignment-position detecting means. Thus, positions relative to the positions of the first STI-type isolation regions 104a preliminarily formed in the region A can precisely be determined using the recesses 110 in the region C as the alignment marks.

Figure 8:
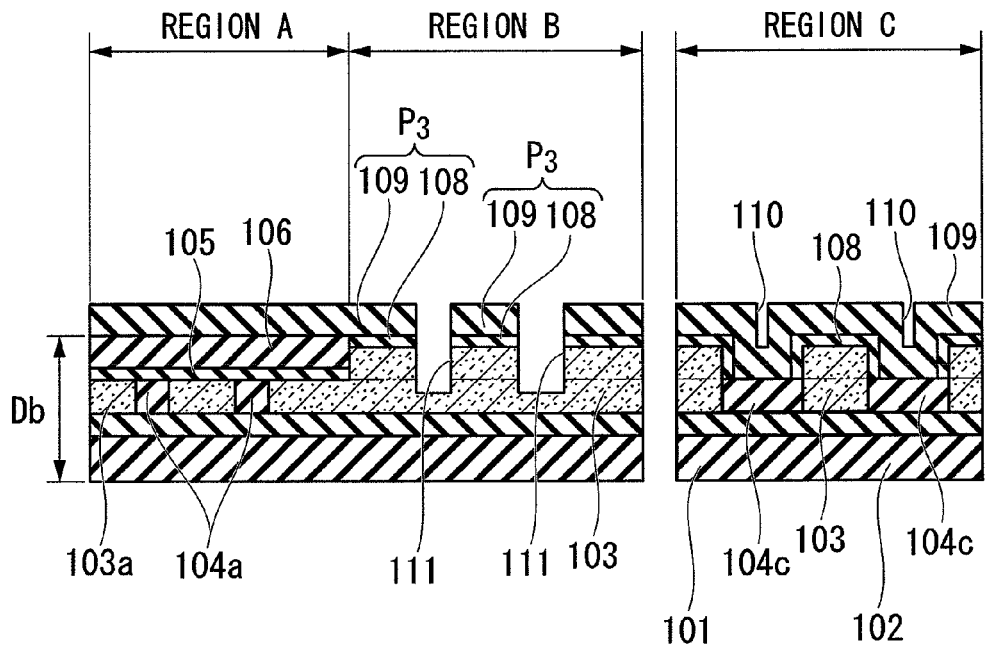

In the process of forming a third mask pattern $P_3$ in the thick region B, the photoresist film 135 is exposed and developed after the alignment explained above to form openings 136 as shown in FIG. 7. Then, the third mask layer $M_3$ including the silicon nitride film 109 and the silicon oxide 108 is etched with the photoresist 135 as a mask, followed by removal of the photoresist 135 to form the third pattern $P_3$ as shown in FIG. 8.

In the process of forming the second STI-type isolation regions 104b, the semiconductor layer 103b including the epitaxial film 107 is etched with the silicon nitride film 109 as the third mask pattern $P_3$ to form recesses 111 for forming the second STI-type isolation regions 104b in the region B. The etching time is adjusted so that the bottom surfaces of the recesses 111 do not contact the insulating layer 102. Lastly, the recesses 111 are filled with a silicon oxide film by CVD to form the second STI-type isolation regions 104b. At this time, the recesses 110 in the region C are also filled with the silicon oxide film 112.

Figure 9:
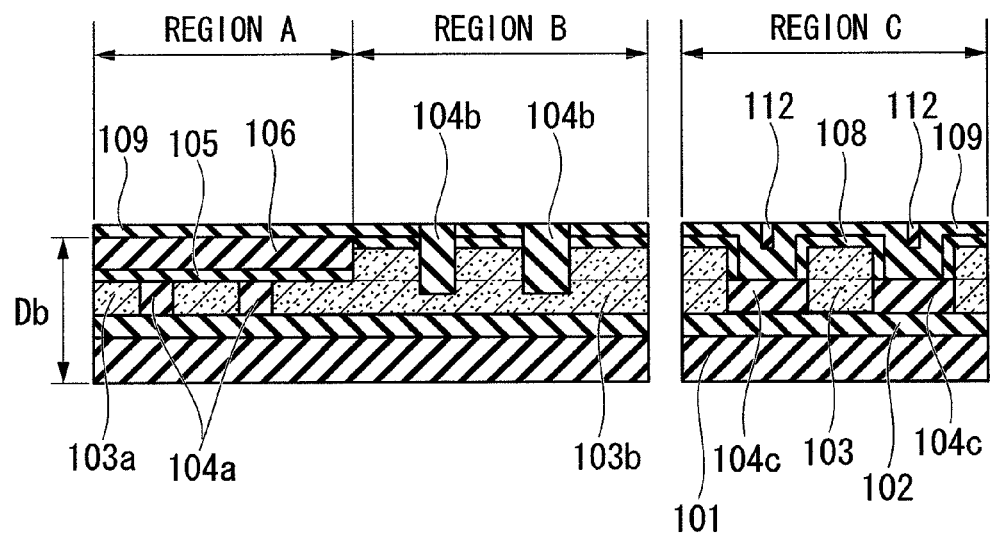

In the process of removing the third mask pattern $P_3$, the surface of the silicon nitride film 109 is planarized by CMP as shown in FIG. 9. Since the upper surfaces of the SOI substrate 100 in the regions A, B, and C are identical in height upon the CMP, a uniformly flat surface can easily be formed.

Figure 10:
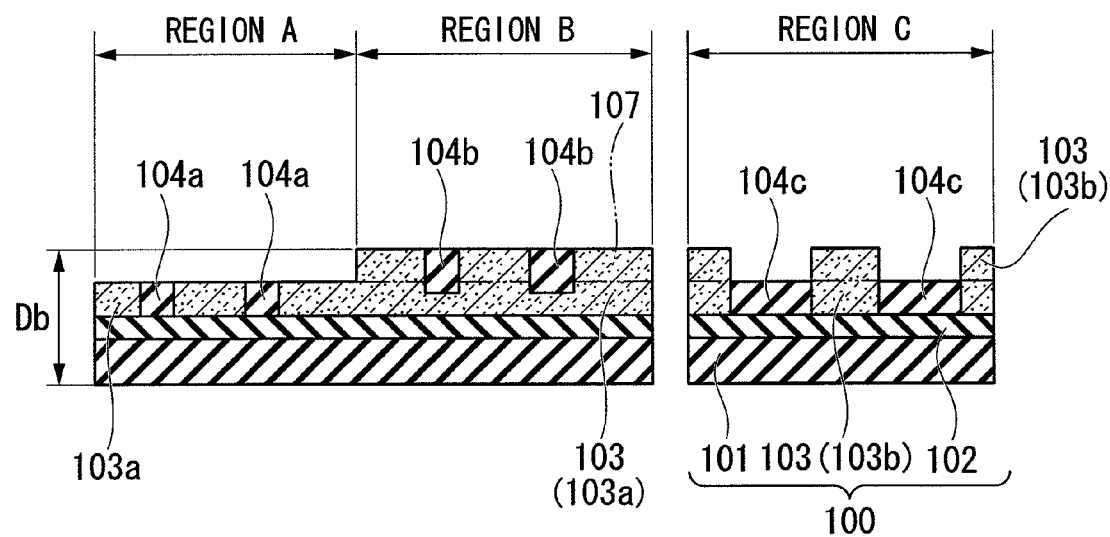

Then, wet etching is performed to make the surface of the second STI-type isolation regions 104b including the silicon oxide film in the region B identical to that of the silicon oxide film 108 in height. Then, the silicon nitride film 106 in the region A and the silicon nitride film 109 are removed by wet etching, followed by removal of the silicon oxide films 105 and 108 by wet etching. Thereby, the silicon oxide film 112 in the region C that has remained in the recesses 110 in the silicon nitride film 109 is removed upon the removal of the silicon oxide film 108. Accordingly, the surfaces of the embedded insulators 104c to be used as alignment marks are finally exposed as shown in FIG. 10.

When the first and the second STI-type isolation regions 104a and 104b are formed by STI on the SOI substrate 100 including the regions A and B of different thicknesses, shapes of the first and the second STI-type isolation regions 104a and 104b can be uniformly formed for the entire SOI substrate 100 in this manner. An alignment of the second STI-type isolation regions 104b is precisely performed with respect to the first STI-type isolation regions 104a which has been formed fast. Thereby, misalignment of the first and the second STI-type isolation regions 104a and 104b can be prevented.

The semiconductor device 1 can be formed by the following general processes being performed after the second STI-type isolation regions 104b are formed.

Figure 11:
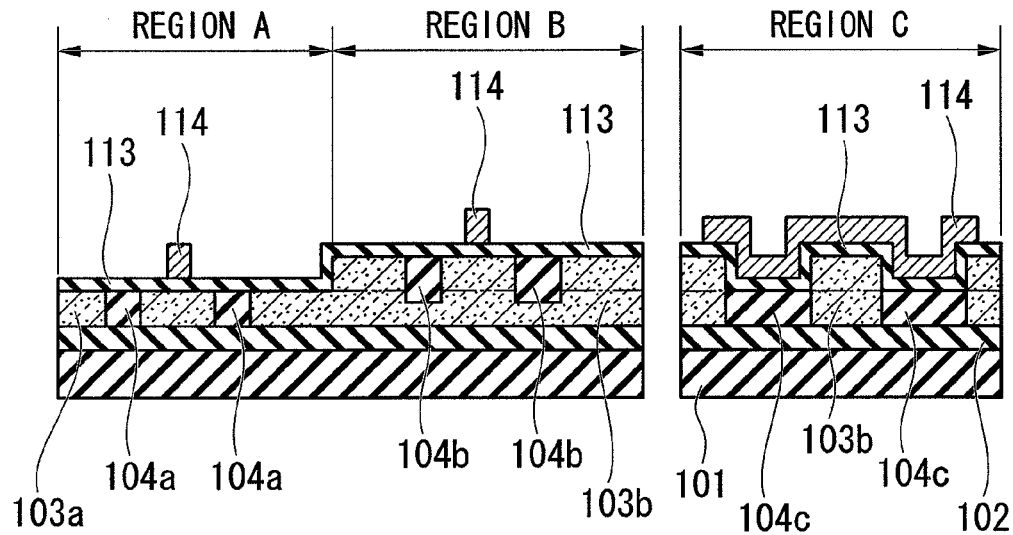

A gate insulating film 113 made of, for example, a silicon oxide film is formed, followed by forming gate electrodes 114 using a poly-silicon film into which an impurity, such as phosphorus, has been implanted as shown in FIG. 11. In the region C, a pattern of the gate electrode 114 is formed to completely cover the embedded insulators 104c so that the pattern is not removed from side surfaces of the recesses including the embedded insulators 104c. Since the surfaces of the SOI substrate 100 are different in height between the regions A and B, the gate electrodes 114 are preferably patterned separately in the regions A and B. Since the alignment marks in the region C are not used in the following processes, illustrations thereof are omitted.

Figure 12:
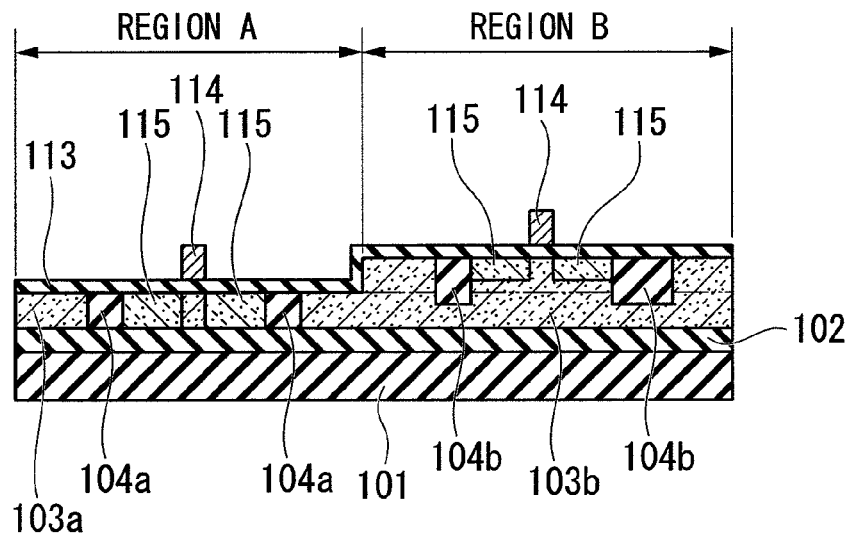

Then, an n-type impurity, such as phosphorus, is ion-implanted to form S/D regions 115 as shown in FIG. 12. When a CMOS circuit is formed at this time, a region into which a p-type impurity, such as boron, is to be implanted may be formed using a mask pattern made of a photoresist film upon the ion-implantation to form both p-and-n-type S/D regions. Since the semiconductor layers 103a and 103b are p-type in the first embodiment, an n-type well region is preliminarily prepared before the gate electrodes are formed if a p-channel transistor is formed.

Figure 13:
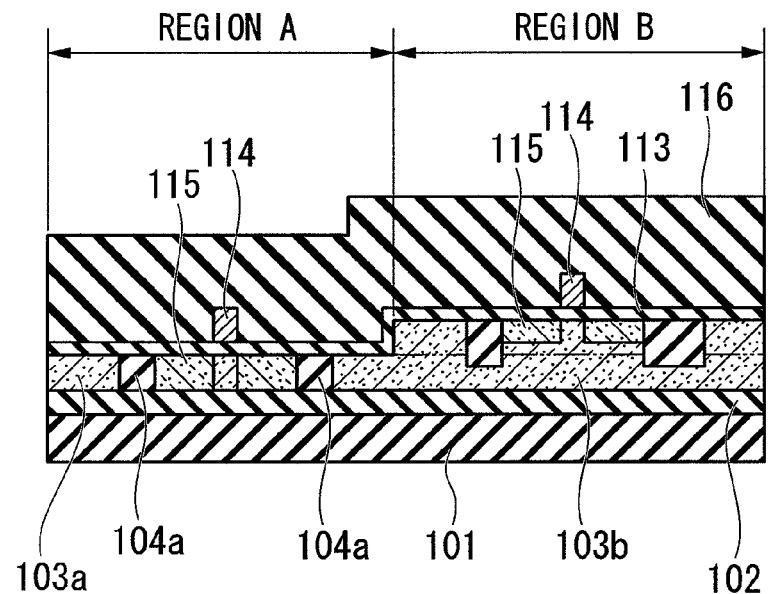
Figure 14:
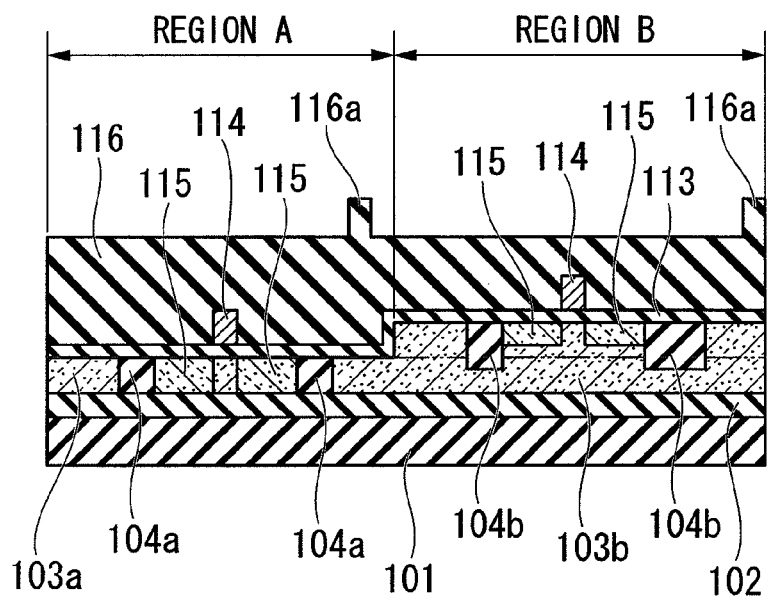

Then, an inter-layer insulating film 116 is formed using, for example, a silicon oxide film as shown in FIG. 13. On the inter-layer insulating film 116, a step between the regions A and B is formed due to the height difference of the underlying SOI substrate 100. It is difficult to planarize the surface of the inter-layer insulating film 116 by CMP due to the step. Therefore, a part of the inter-layer insulating film 116 in the region B is removed with a patterned photoresist film (not shown) as a mask so that only outer ridges 116a of the region B remain and the surface of the removed portion of the inter-layer insulating film 116 in the region B is substantially identical in height to the inter-layer insulating film 116 in the region A as shown in FIG. 14. Then, the surface of the inter-layer insulating film 116 is planarized by CMP. Since only the outer ridges 116a whose areas are smaller than that of the surface of the entire SOI substrate 100 remain before the CMP, a flat surface can easily be achieved by CMP.

Figure 15:
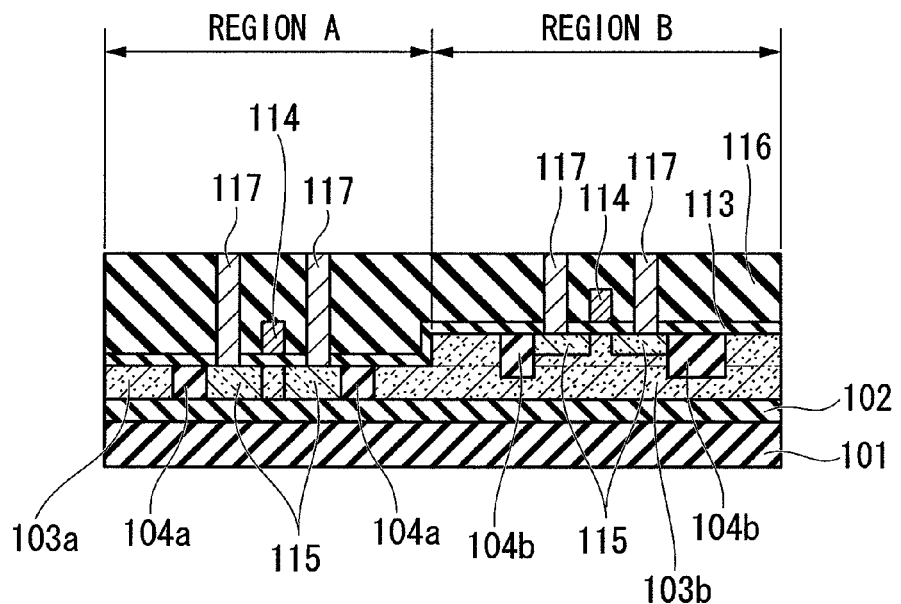

Then, contact plugs 117 made of, for example, tungsten (W) and connected to the S/D regions 115 are formed as shown in FIG. 15. Contact plugs connected to the gate electrodes 114 are similarly formed (not shown).

Figure 16:
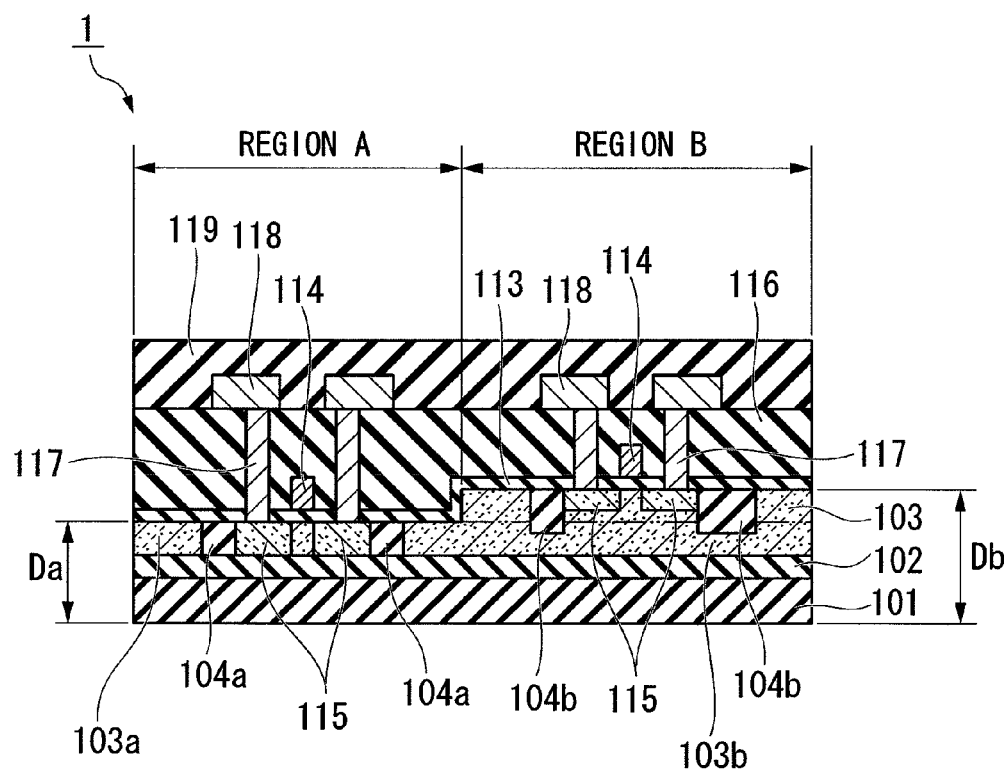

Then, a wiring layer 118 connected to the contact plugs 117 is formed using, for example, aluminum (AL), copper (Cu), or tungsten as shown in FIG. 16, followed by forming the insulating layer 119 for protecting the surface and the like, and thereby the semiconductor device 1 is completed. Another wiring layer may be provided on the wiring layer 118 according to need. As explained above, the semiconductor device 1 includes the semiconductor layer including the thin film region A of the thickness Da and the thick film region B of the thickness Db. Even if miniaturization of semiconductor devices further progresses, the semiconductor device 1 including the semiconductor layer including the two regions of different thicknesses can easily be formed using the manufacturing method of the first embodiment.

According to the semiconductor device 1 of the first embodiment as explained above, the semiconductor layer 103 includes the thin film region A and the thick film region B respectively including the first and the second STI-type isolation regions 104a and 104b. Accordingly, the semiconductor device 1 can be provided in which the shapes of the first and the second STI-type isolation regions 104a and 104b formed in the regions A and B of different thicknesses included in the semiconductor layer 103 are optimized.

Additionally, the semiconductor layer 103 includes the alignment mark region C formed by the epitaxial film 107 being formed on the semiconductor layer 103a. In the alignment mark region C, the alignment marks (recesses 110) are formed on the embedded insulators 104c formed at the same time with the first STI-type isolation regions 104a. The alignment of the second STI-type isolation regions 104b is performed using the alignment marks (recesses 110). Accordingly, the second STI-type isolation regions 104b can precisely be formed by alignment using the alignment marks (recesses 110) even if the first and the second STI-type isolation regions 104a and 104b are separately formed in the regions A and B of different thicknesses. Therefore, misalignment of the separately formed STI-type isolation regions 104a and 104b can be prevented, and miniaturization can be simplified.

Further, the bottom surfaces of the embedded insulators included in the second STI-type isolation regions 104b formed in the thick film region B are not in contact with the insulating film 102. Accordingly, a potential of the semiconductor layer 103b in the thick film region B can easily be fixed by a given voltage being applied to the semiconductor layer 103b in the thick film region B.

According to the method of manufacturing the semiconductor device 1 of the first embodiment, the first and the second STI-type isolation regions 104a and 104b are separately formed by STI in the SOI substrate 100 including the regions A and B of different thicknesses. Accordingly, miniaturization can easily be achieved since a problem of focal depth does not arise in lithography. Additionally, the shapes of the first and the second STI-type isolation regions 104a and 104b can uniformly be formed over the entire SOI substrate 100 since the step of the underlying semiconductor layer 103 does not affect the inter-layer insulating film 116 being planarized by CMP. Therefore, the method of manufacturing the semiconductor device 1 by which miniaturization of the semiconductor device 1 is easily achieved can be provided.

Further, the alignment of the second STI-type isolation regions 104b is performed using the alignment marks (recesses 110) formed in the alignment mark region C when the first and the second STI-type isolation regions 104a and 104b are separately formed in the regions A and B of different thicknesses. Therefore, the method of manufacturing the semiconductor device 1 can be provided by which misalignment of the separately formed STI-type isolation regions 104a and 104b can be prevented, and miniaturization can be simplified.

Second Embodiment

Figure 17:
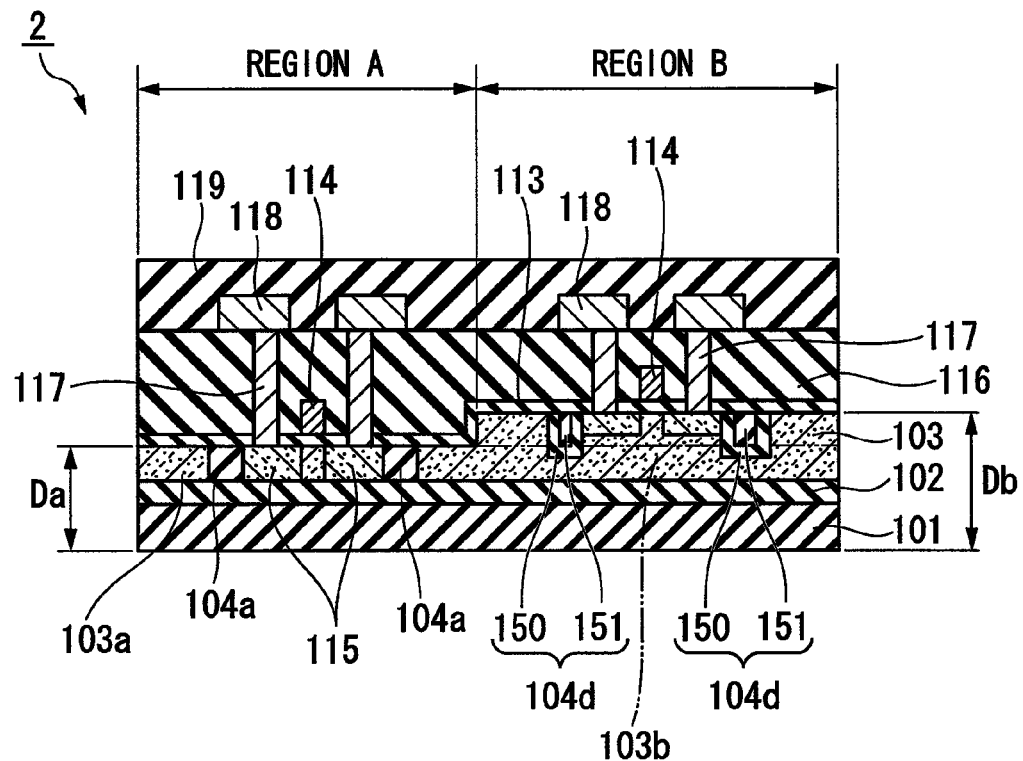
FIG. 17 is a cross-sectional view illustrating a semiconductor device according to a second embodiment of the present invention.

The structure of a semiconductor device 2 according to a second embodiment of the present invention is explained. FIG. 17 is a cross-sectional view illustrating the semiconductor device 2.

In the second embodiment, only the structure of second STI-type isolation regions 104d differs from that of the second STI-type isolation regions 104b of the first embodiment, and other elements are identical to those of the first embodiment. Therefore, like reference numerals represent like elements of the first embodiment, and explanations thereof are omitted.

The second STI-type isolation regions 104d provided in the thick region B are formed by filling, with an SOG (Spin On Glass) layer 151, the recesses 111 which have not completely been filled with the silicon oxide film 150 and whose inner surfaces are covered by the silicon oxide film 150. The SOG layer 151 is an insulator in a solution state made of, for example, polysilazane.

In the second embodiment, the structures of the first and the second STI-type isolation regions in the regions A and B differ from each other. In the region B, the recesses 111 which will be the second STI-type isolation regions 104d are deep as shown in FIG. 8, and the aspect ratio thereof is larger than that of the recesses 132 in the region A as shown in FIG. 2. Accordingly, it is difficult to fill the recesses 111 with only a single layer of a silicon oxide film as in the first embodiment when miniaturization further progresses, causing a void. For this reason, the second STI-type isolation regions 104d are formed to have a two-layer structure of the silicon oxide film 150 and the SOG layer 151, preventing a void and therefore enabling easy miniaturization. Although the first STI-type isolation regions 104a in the region A can also be formed to have the two-layer structure, the number of processes is increased. As a result, the first and the second STI-type isolation regions 104a and 104d in the regions A and B are formed to have different structures and be optimized as in the second embodiment, preventing an increase in manufacturing costs.

Figure 18:
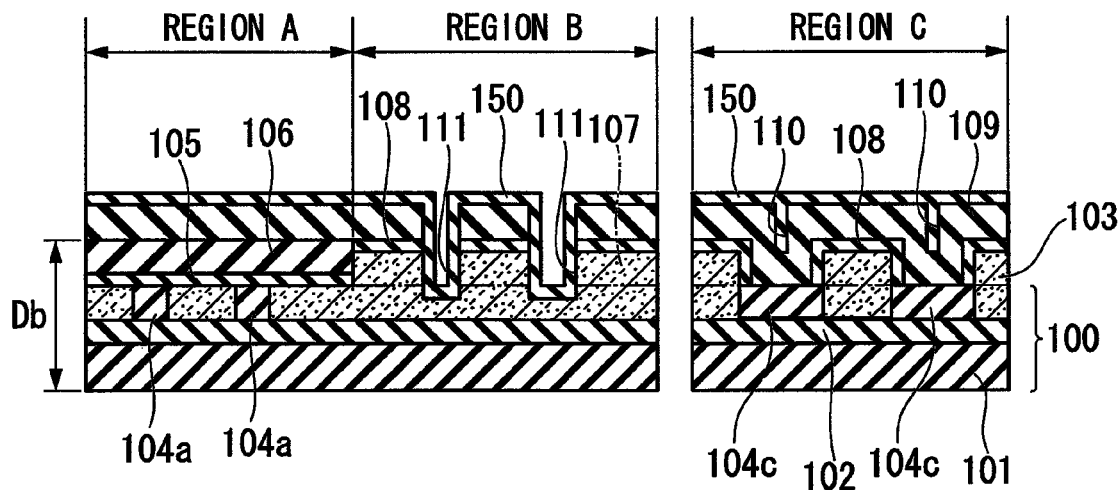
FIGS. 18 to 20 are cross-sectional views indicative of a schematic process flow illustrating a method of manufacturing the semiconductor device according to the second embodiment.
Figure 19:
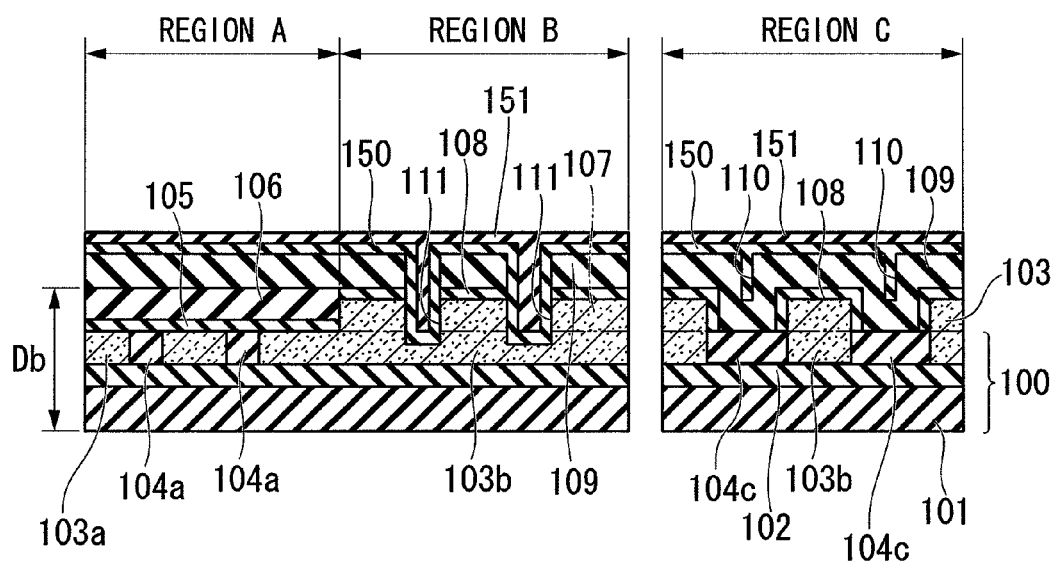
Figure 20:
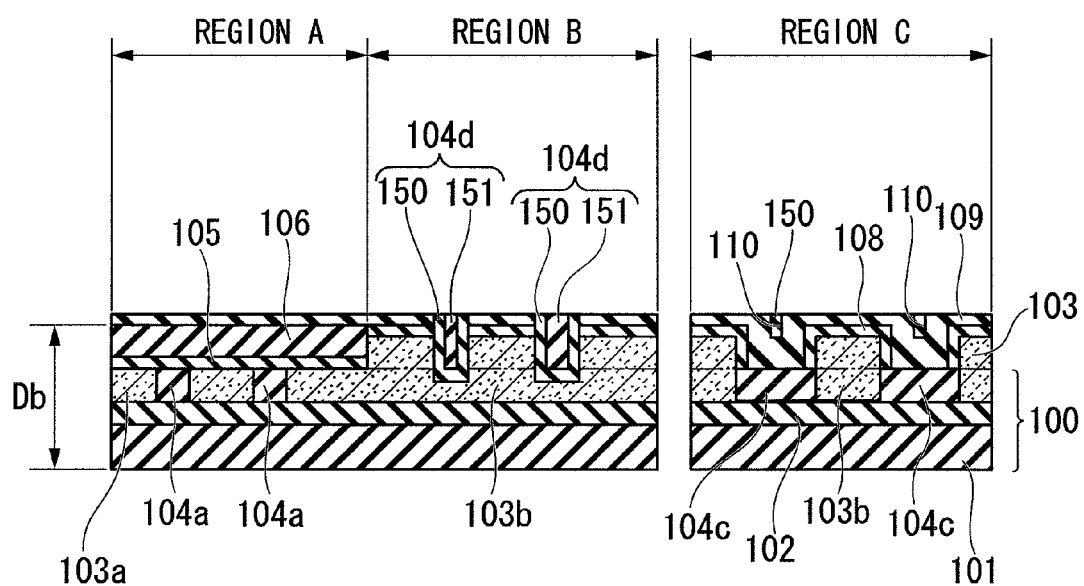

Hereinafter, a method of manufacturing the semiconductor device 2 is explained. FIGS. 18 to 20 are cross-sectional views indicative of a schematic process flow illustrating a method of manufacturing the semiconductor device 2.

The recesses 111 for forming the second STI-type isolation regions 104d in the region B are formed by similar processes to those in the first embodiment, as shown in FIG. 8. Then, the silicon oxide film 150 is formed with a thickness not to completely fill the recesses 111 in the region B as shown in FIG. 18. Since the alignment marks in the region C have already been used upon the alignment in the previous process, the recesses 110 in the region C may be completely filled with the silicon oxide film 150.

Then, the SOG layer 151 is formed by spin coating to completely fill the recesses 111 as shown in FIG. 19. The SOG layer 151 is formed by application and made into solid by a bake process at 400 to 900° C.

Then, the surface of the SOG layer 151 is planarized by CMP as shown in FIG. 20, followed by the similar processes of the first embodiment as shown in FIGS. 10 to 16, and thereby the semiconductor device 2 is completed.

By the use of the above method, the semiconductor device 2 can easily be manufactured even if the first and the second STI-type isolation regions 104a and 104b in the regions A and B of different thicknesses have different structures.

According to the semiconductor device 2 of the second embodiment as explained above, the embedded insulator included in the second STI-type isolation region 104d includes a thermal oxide film (silicon oxide film 150) formed on the inner surface of the recesses 111 and the SOG film 151 covering the thermal oxide film. Accordingly, the semiconductor device 2 can be provided in which the STI-type isolation regions 104a and 104d that have different structures and are optimized are formed in the regions A and B of the different thicknesses included in the semiconductor layer 103.

According to the method of manufacturing the semiconductor device 2 of the second embodiment, the STI-type isolation regions 104a and 104d that have different structures and are optimized can easily be formed in the regions A and B of the different thicknesses included in the semiconductor layer 103. Therefore, manufacturing costs can be prevented, and the method of manufacturing the semiconductor device 2 more suitable to miniaturization can be provided.

Third Embodiment

When the present invention is applied, the specific layout of the regions A, B, and C on a semiconductor chip is not particularly limited, and each region can be arranged at a desired position. A case where the present invention is applied to an MPU (Micro Processing Unit) chip including DRAM as cash memory is explained as a third embodiment of the present invention. An MPU chip is formed on the SOI substrate.

Figure 21:
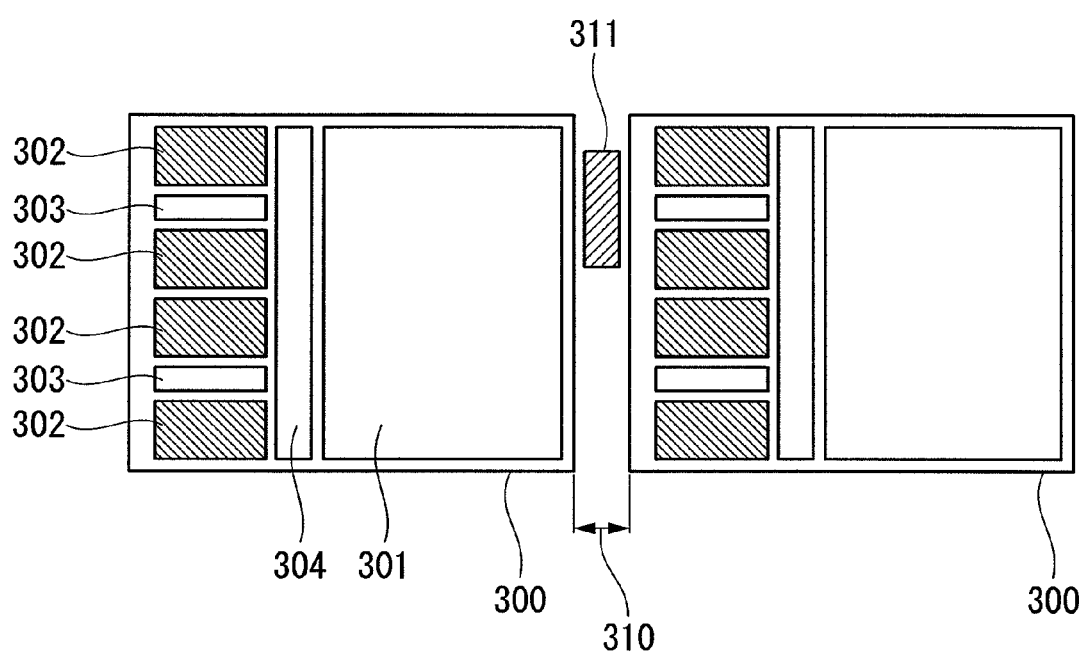
FIG. 21 is a plane view illustrating the layout of an MPU chip according to a third embodiment of the present invention.
Figure 22A:
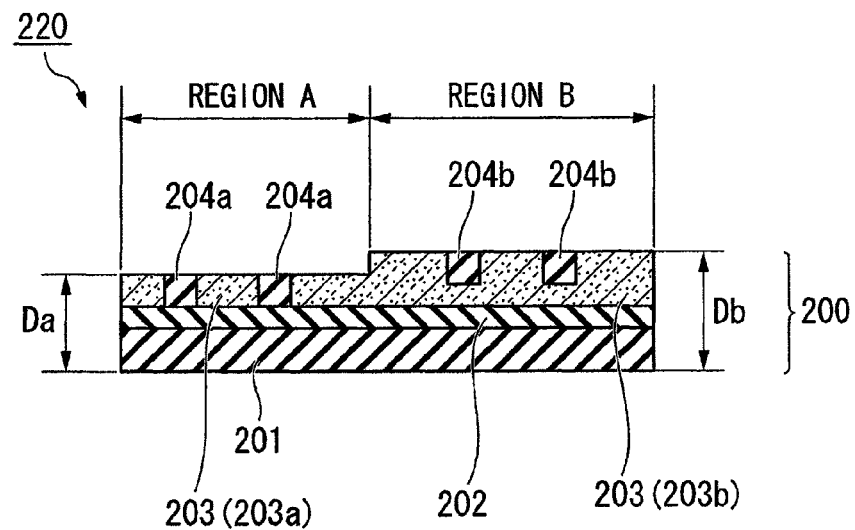
FIGS. 22A, 22B, and 23 are cross-sectional views indicative of a schematic process flow illustrating a method of manufacturing a conventional semiconductor device.
Figure 22B:
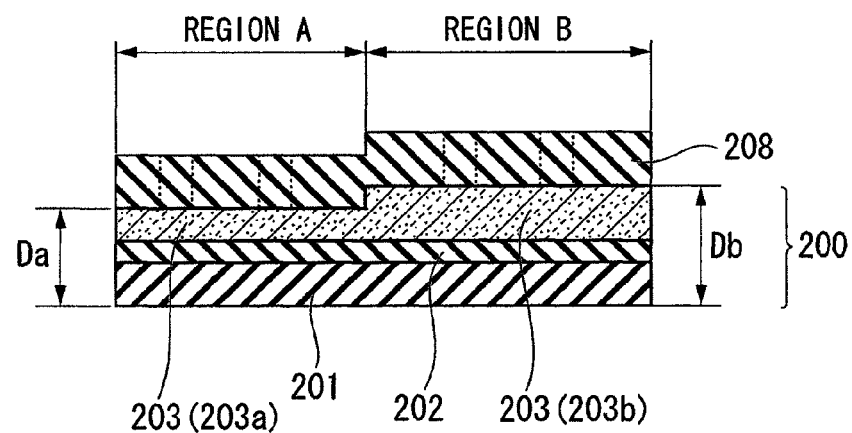
Figure 23:
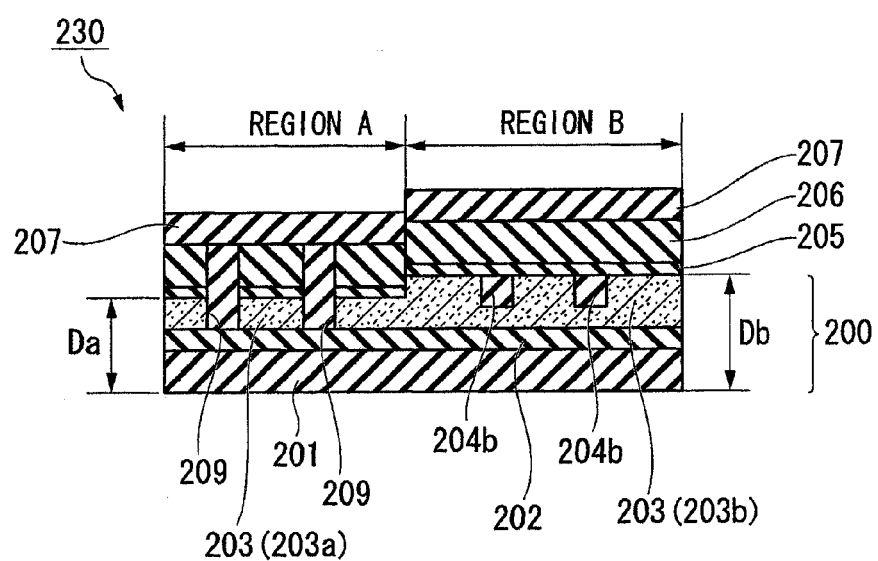

FIG. 21 is a plane view illustrating MPU chips 300 according to the third embodiment of the present invention. The two MPU chips 300 each including the same circuit pattern are adjacently arranged. A dicing-line portion 310 for a dicing into chip pieces upon packaging is provided between the adjacent MPU chips 300.

The MPU chip 300 includes a logic circuit 301 and multiple memory cells 302 of DRAM as cash memory. The memory cell 302 is capacitorless, made to have the structure of region A explained in the first embodiment, and includes a floating-gate MOS transistor. Data is stored in the memory cell 302 by the use of a change in a threshold voltage of the MOS transistor. A sense amp 303 is provided between adjacent memory cells 302. The sense amp 303 converts the data stored in the memory cell 302 as a change in a threshold voltage into binary data (High or Low) that can be processed by the logic circuit 301, and outputs the converted data. The sense amp 303 is made to have the structure of the region B explained in the first embodiment. Thereby, a threshold voltage of the MOS transistor is not changed during operation, and therefore stable circuit operation is enabled.

An interface circuit 304 controls transmission and reception of data between the sense amp circuit 303 and the log circuit 301. The logic circuit 301 and the interface circuit 304 are made to have the structure of the region B. Thereby, a threshold voltage of the MOS transistor is not changed during operation, and therefore stable circuit operation is enabled.

As explained above, only the memory cell 302 has the structure of the region A and the other circuits have the structure of the region B in the MPU chip 300. Additionally, an alignment mark 311 having the structure of the region C is provided at a part of the dicing-line portion 310. Thereby, areas on the SOI substrate can effectively be used without a waste.

Further, alignment of the regions A, B, and C and the ratio of occupied areas are not particularly limited as explained above. Therefore, a semiconductor device of high performance can easily be manufactured by the manufacturing method of the present invention being applied after the layout of each region is determined.

Materials and the like to be used in each process of the embodiments explained above are not limited thereto and can be changed without departing from the scope of the present invention. The present invention is applicable to a semiconductor device not including a storage element, such as DRAM or SRAM.

It is apparent that the present invention is not limited to the above embodiments, but may be modified and changed without departing from the scope and spirit of the invention.

What is claimed is:

1. A semiconductor device, comprising:
   an SOI substrate including a support substrate, an insulating layer deposited on the support substrate, and a semiconductor layer which includes a thin film region and a thick film region, wherein the thin film region comprises a first semiconductor layer deposited on the support substrate, and the thick film region comprises the first semiconductor layer and a second semiconductor layer deposited on a part of the first semiconductor layer;
   a first STI-type isolation region disposed at the thin film region;
   a second STI-type isolation region disposed at the thick film region; and
   an alignment mark region disposed at the thick film region,
   wherein an alignment mark to be used for alignment of the second STI-type isolation region is disposed at the alignment mark region, and
   wherein the alignment mark is a pattern of openings which are formed in the alignment mark region and filled with a third insulator embedded in the first semiconductor layer.

2. The semiconductor device according to claim 1, wherein a position of the second STI-type isolation region is fixed in accordance with a position of the first STI-type isolation region.

3. The semiconductor device according to claim 1, wherein
   a bottom surface of a first insulator embedded in the first STI-type isolation region is in contact with the insulating layer, and
   a bottom surface of a second insulator embedded in the second STI-type isolation region is not in contact with the insulating layer.

4. The semiconductor device according to claim 1, wherein a bottom surface of the third insulator is in contact with the insulating layer.

5. The semiconductor device according to claim 1, wherein a structure of the first insulator is different from that of the second insulator.

6. The semiconductor device according to claim 5, wherein the second insulator comprises an insulating film formed by spin coating.

7. The semiconductor device according to claim 1, wherein a memory cell is 15 formed in the thin film region.

8. The semiconductor device according to claim 7, wherein a sense amp circuit to be used for accessing data stored in the memory cell is formed in the thick film region.

9. A method of manufacturing a semiconductor device, comprising:
   preparing an SOI substrate comprising a support substrate, an insulating layer deposited on the support substrate, and a semiconductor layer deposited on the insulating layer;
   forming a first STI-type isolation region in a first region of the semiconductor layer;
   forming a first mask layer to cover an upper surface of the semiconductor layer at the first region;
   forming a semiconductor film on the semiconductor layer uncovered by the first mask layer to form a second region of the semiconductor layer;
   forming a second mask layer to cover an upper surface of the first mask layer at the first region and an upper surface of the semiconductor film at the second region;
   forming an opening pattern in the second mask layer in the second region;
   forming a second STI-type isolation region in the second region using the opening pattern; and
   removing the first mask layer and the second mask layer.

10. The method according to claim 9, wherein an upper surface of the second mask layer is substantially flat over the first region and the second region before the first mask layer and the second mask layer in the first region are removed.

11. The method according to claim 9, wherein the semiconductor film is a silicon film formed by epitaxial growth.

12. The method according to claim 9, further comprising:
   embedding an insulator in the semiconductor layer to form an alignment mark in the second region;
   forming the semiconductor film on the semiconductor layer to form a recess on the insulator of the alignment mark; and
   performing alignment of the opening pattern using a light being irradiated to and reflected from the recess.

13. The method according to claim 9, further comprising:
forming a first insulator embedded in the semiconductor layer by CVD to form the first STI-type isolation region; and
forming a second insulator deposited on the first insulator by spin coating to form the second STI-type isolation region.

14. The method according to claim 13, wherein the second insulator comprises an SOG film.

15. The method according to claim 9, wherein the first STI-type isolation region and the second STI-type isolation region are formed by different material.

16. A method of manufacturing a semiconductor device comprising an SOI substrate, comprising a support substrate, an insulating layer deposited on the support substrate, and a semiconductor layer deposited on the insulating layer, the method comprising:
forming a pair of first STI-type isolation regions in a first region of the semiconductor layer;
forming a first mask layer to cover the first region;
forming a semiconductor film on the semiconductor layer uncovered by the first mask layer to form a second region of the semiconductor layer;
forming a second mask layer to cover the first region and the second region;
forming an opening pattern in the second mask layer in the second region;
forming a pair of second STI-type isolation regions in the second region using the opening pattern; and
removing the first mask layer and the second mask layer in the first region.

17. The method according to claim 16, further comprising:
forming a gate insulating film over the first region and the second region;
forming a gate electrode on the gate insulating film in each of the first region and the second region; and
forming first source-and-drain regions in the semiconductor layer between the first STI-type isolation regions at both sides of the gate electrode in the first region, and second source-and-drain regions in the semiconductor film between the second STI-type isolation regions at both sides of the gate electrode in the second region.

18. The method according to claim 17, wherein bottom surfaces of the first source-and-drain regions are in contact with the insulating layer of the SOI substrate and bottom surfaces of the second source-and-drain regions are not in contact with the insulating layer of the SOI substrate.

19. The method according to claim 17, further comprising:
forming an inter-layer insulating film over the gate insulating film and the gate electrode after the first source-and-drain regions and the second source-and-drain regions 20 are formed;
forming, in the inter-layer insulating film, first contact plugs connected to respective first source-and-drain regions and second contact plugs connected to respective second source-and-drain regions; and
forming a wiring layer connected to the first source-and-drain regions and the second source-and-drain regions on the inter-layer insulating film.

* * * * *